United States Patent [19]

Maekawa

[11] Patent Number: 4,972,252
[45] Date of Patent: Nov. 20, 1990

[54] PHOTOSENSOR WITH A CAPACITOR CONNECTED IN PARALLEL SO AS TO INCREASE THE DYNAMIC RANGE AND TO IMPROVE THE HOLDING CHARACTERISTICS OF THE PHOTOSENSOR

[75] Inventor: Toshikazu Maekawa, Kanagawa, Japan

[73] Assignee: Sony Corporation, Tokyo, Japan

[21] Appl. No.: 442,406

[22] Filed: Nov. 28, 1989

Related U.S. Application Data

[63] Continuation of Ser. No. 201,168, Jun. 2, 1988, abandoned.

[30] Foreign Application Priority Data

Jun. 25, 1987 [JP] Japan .................................. 62-159123

[51] Int. Cl.$^5$ ............................................. H01L 27/14
[52] U.S. Cl. ......................................... 357/58; 357/30; 357/51
[58] Field of Search ......................... 357/58, 51, 30 D

[56] References Cited

U.S. PATENT DOCUMENTS 4,717,946 1/1988 Godfrey .......................... 357/30 D

FOREIGN PATENT DOCUMENTS 0162307 11/1985 European Pat. Off. .

OTHER PUBLICATIONS

Japanese Abstract, vol. 10, No. 379 E–465 2436, Dec. 18, 1986, Image Sensor 61-172367A.
Japanese Abstract, vol. 9, No. 35 E–296 1758, Feb. 14, 1985, Image Sensor 59-177964A.

Primary Examiner—James W. Davie
Attorney, Agent, or Firm—Hill, Van Santen, Steadman & Simpson

[57] ABSTRACT

A photosensor has a PIN photodiode and a piling-type capacitor is connected in parallel with the PIN photodiode so as to increase the reverse bias capacitance of the PIN photodiode so as to increase the dynamic range.

3 Claims, 3 Drawing Sheets

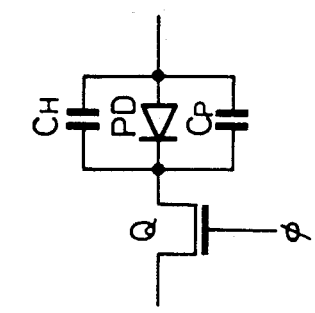
FIG. 7
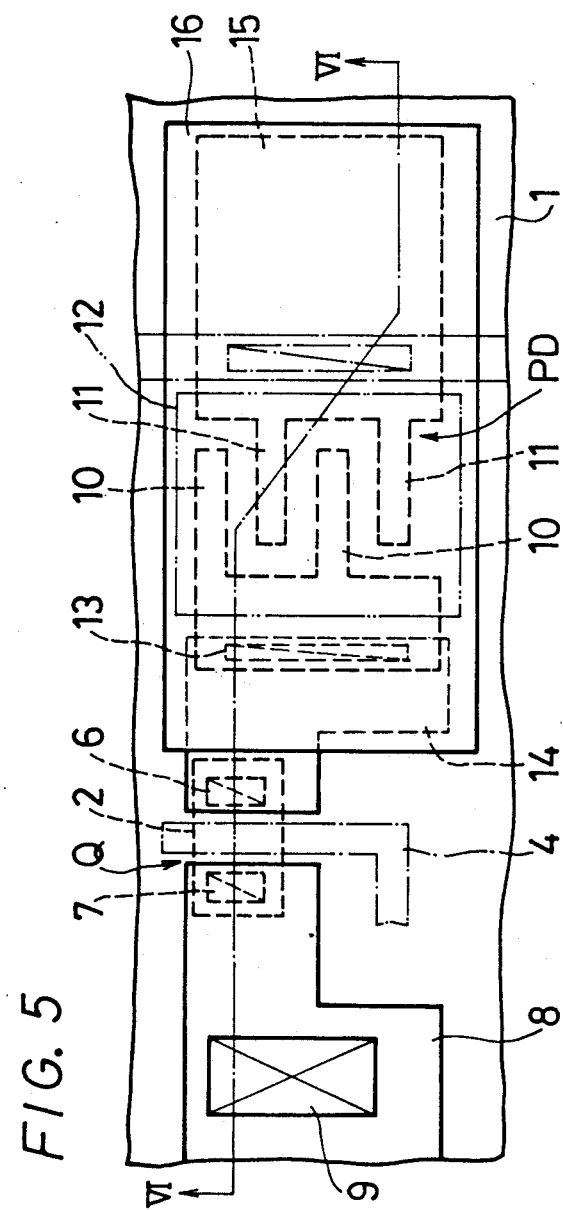
FIG. 5
FIG. 6

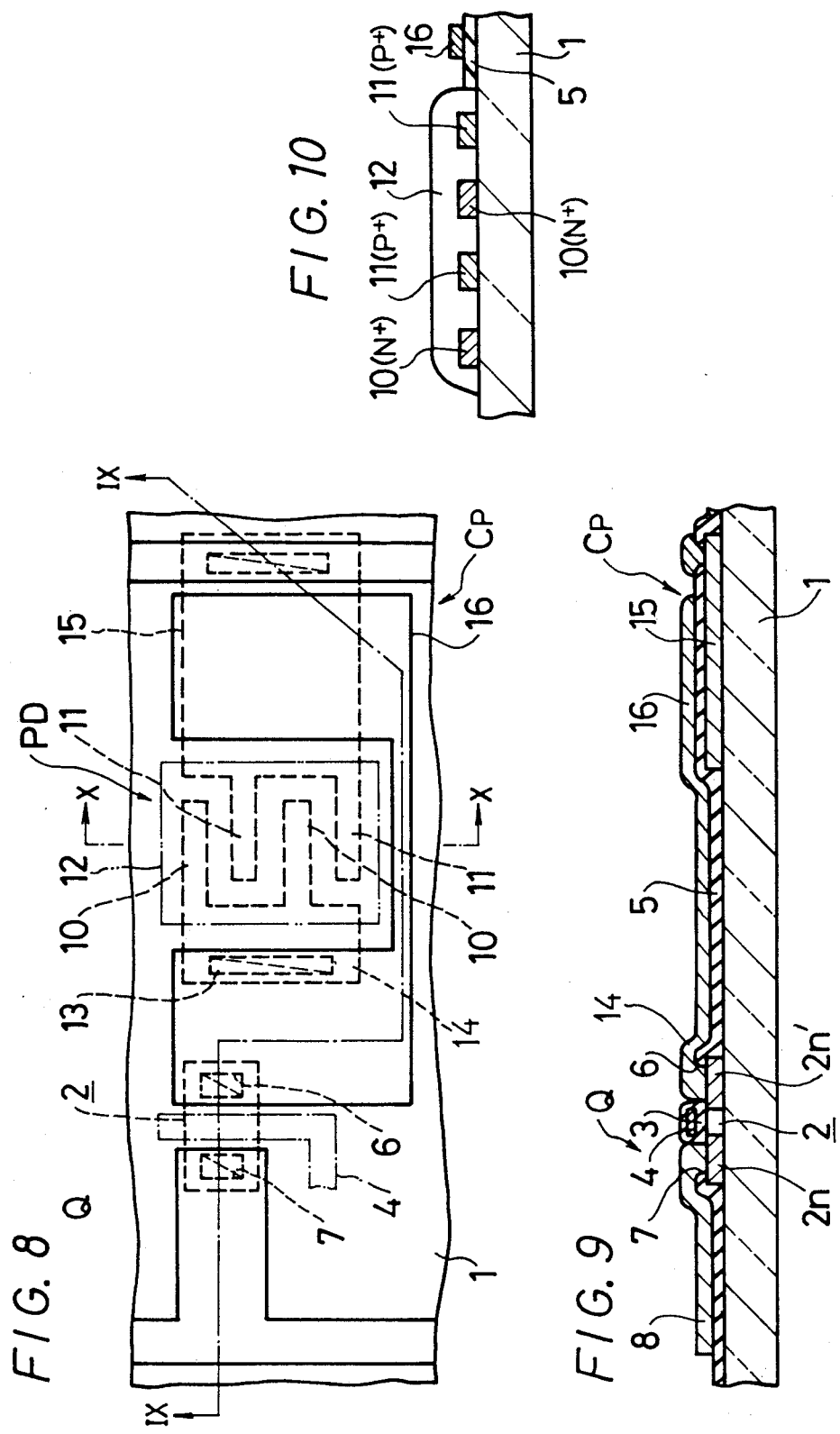

PHOTOSENSOR WITH A CAPACITOR CONNECTED IN PARALLEL SO AS TO INCREASE THE DYNAMIC RANGE AND TO IMPROVE THE HOLDING CHARACTERISTICS OF THE PHOTOSENSOR

This is a continuation, of application Ser. No. 201,168, filed June 2, 1988, now abandoned.

BACKGROUND OF THE INVENTION

1. Field of the Invention

The present invention relates generally to a photosensor, and more particularly to a photosensor which includes a PIN photodiode which is formed of a P-type semiconductor layer, an intrinsic semiconductor layer and an N type semiconductor layer arranged laterally on an insulating substrate.

2. Description of the Prior Art

There has been proposed a photosensor as shown in FIG. 1 which is formed of a P-type semiconductor layer b and an N-type semiconductor layer c separated with an appropriate interval on a transparent insulating layer a made of quartz or the like. An intrinsic (I) amorphous semiconductor layer d is deposited between the P-type semiconductor layer b and the N-type semiconductor layer c so as to provide a lateral PIN photodiode PD which serves as a light receiving element. FIG. 2 shows an equivalent circuit diagram of the PIN photodiode PD. The PIN photodiode PD comprises a photo detecting circuit with a MOS transistor Q serially connected therewith, as shown in FIG. 3. A symbol $\phi$ designates a switching pulse for switching the MOS transistor Q and the reference letter $C_H$ represents an equivalent reverse bias capacitance of the PIN photodiode PD.

The lateral PIN photodiode PD can be manufactured in a manufacturing process which is the process for a PIN photodiode of sandwich construction which is formed of a P-type semiconductor layer, an intrinsic (I) amorphous semiconductor layer and an N-type semiconductor layer which are formed by one layer on another layer. The invention also requires a photo mask pattern which is relatively simple. Thus, the lateral PIN photodiode PD of the invention allows the production costs to be reduced.

However, although the lateral PIN photodiode PD has an advantage of a simple manufacturing process and a relatively simple photo mask pattern as mentioned above, the reverse bias capacitance $C_H$ is small, which causes a narrow dynamic range and an undesirable signal holding characteristic.

Due to the difference in construction between an ordinary sandwich PIN photodiode and a lateral PIN photodiode, the reverse bias capacitance $C_H$ of the lateral PIN is always extremely small, e.g. 1/20 or less that of the sandwich PIN photodiode. This problem will be explained in detail with reference to FIG. 4.

FIG. 4 is a characteristic graph showing the output voltage of the photo detector circuit shown in FIG. 3 in a dark field, specifically, the change in the output voltage of the photo detector circuit when the transistor Q is turned off from an on-state by the switching pulse $\phi$ wherein the abcsissa represents time t.

As is apparent from FIG. 4, with the previously proposed photosensor which employs a lateral PIN photodiode as a light receiving element, if the switching pulse $\phi$ falls as shown by the solid line, the output voltage Vx which is at substantially the same level as a source voltage Vv will abruptly decrease to ground level. On the other hand, with a sandwich PIN photodiode of the same size as the lateral PIN photodiode, the output voltage Vx slowly decreases from the source voltage level to ground level as shown by dashed line. This difference results due to the differences in the reverse bias capacitances between the sandwich and lateral PIN photodiodes. Specifically, the lateral PIN photodiode has a reverse bias capacitance which is far smaller than that of the sandwich PIN photodiode.

If the reverse bias capacitance is small, only a small amount of photo current causes the terminal voltage of the reverse bias capacitance $C_H$ to be maximum. In other words, the reverse bias capacitance is saturated with a small amount of photo current, which causes the dynamic range to be very narrow. Further, the holding characteristic which determines how long a signal can be held becomes short, which is not a desirable characteristic for a photosensor.

OBJECTS AND SUMMARY OF THE INVENTION

The present invention solves the above-mentioned problems and has an object to provide a photosensor which employs a lateral PIN photodiode as a light receiving element which has a wide dynamic range so as to improve the signal holding characteristic.

To achieve the above object, the present invention provides a photosensor comprising: a PIN photodiode formed of a P-type semiconductor layer, an intrinsic semiconductor layer and an N-type semiconductor layer which are arranged in parallel on an insulating substrate; and a capacitor is formed of a first electrode which is connected to one of the P-type semiconductor layer or the N-type semiconductor layer and a second electrode is formed on the first electrode through an insulating layer and is connected to the other one of the P-type semiconductor layer or the N-type semiconductor layer.

These and other objects, features and advantages of the present invention will become apparent from the following detailed description of the preferred embodiments taken in conjunction with the accompanying drawings, throughout which like reference numerals designate like elements and parts.

BRIEF DESCRIPTION OF THE DRAWINGS

FIG. 5 is a plan view showing patterns of respective layers of a first embodiment of a photosensor according to the present invention with an insulating layer removed;

FIG. 6 is a cross-sectional view taken along a line VI—VI of FIG. 5;

FIG. 7 is a schematic diagram showing a photo detecting circuit;

FIG. 8 is a plan view showing patterns of respective layers of a second embodiment of a photosensor according to the present invention;

FIG. 9 is a cross-sectional view taken along a line IX—IX of FIG. 8; and

FIG. 10 is a cross-sectional view taken along a line X—X in FIG. 8.

DESCRIPTION OF THE PREFERRED EMBODIMENTS

Figure 1:
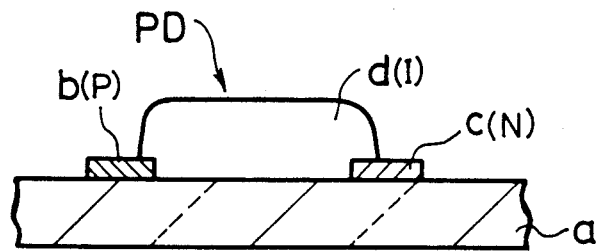
FIG. 1 is a cross-sectional view showing a previously proposed photosensor.
Figure 2:
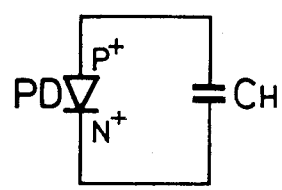
FIG. 2 is a schematic circuit diagram showing an equivalent circuit of a PIN photodiode PD.
Figure 3:
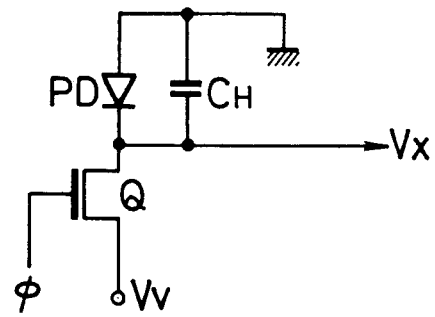
FIG. 3 is a schematic circuit diagram showing a photo detecting circuit.

A first embodiment of a photosensor according to the present invention will be described with reference to FIGS. 5 to In the drawings, a transparent insulating substrate 17 made e.g. of glass or the like carries a semiconductor layer 2 which is formed with a drain, a channel and a source of an N-channel MOS transistor Q. N-channel regions 2n and 2n' form a drain and a source. An insulating layer 3 is the gate of the MOS transistor Q. A silicon gate electrode 4 and an insulating layer 5 are also shown. A window portion 6 for supplying a source electrode is shown. A window portion 7 for supplying a drain electrode is shown. A wiring layer 8 made of aluminum is connected to the drain 2n of the MOS transistor Q through the window portion 7, and a window portion 9 is the bonding pad of the wiring layer 8.

An N+-type semiconductor layer 10 constituting a PIN photodiode PD is formed in a comb shape. A P+-type semiconductor 11 is also formed in a comb shape. The N+-type semiconductor layer 10 and the P+-type semiconductor layer 11 are located so that as shown in FIG. 5 they have interdigital projections which are intermeshed as shown with constant distances between them. The N+-type semiconductor layer 10 and the P+-type semiconductor layer 11 are thus formed in a comb shape and are arranged so as to face each other so that the ratio of the facing area to the area occupied is increased to thereby provide a larger photo current and consequently to increase the sensitivity.

An amorphous intrinsic (I) semiconductor thin layer 12 is formed in a portion above and between the N+-type semiconductor layer 10 and the P+-type semiconductor layer 11. The intrinsic (I) semiconductor thin layer 12, the N+-type semiconductor layer 10 and the P+-type semiconductor 11 constitute the PIN photodiode PD. A window portion 13 allows the surface of the N+-type semiconductor layer 10 to be exposed. A wiring layer 14 made of aluminum is connected, at one end portion thereof, with the surface of the source of the MOS transistor Q through the window portion 6, and, at the other end portion with the surface of the N+-type semiconductor layer 10 which forms the PIN photodiode PD through the window portion 13. Thus, the wiring layer 14 serves to serially connect the MOS transistor Q with the PIN photodiode PD.

A P+-type semiconductor layer 15 shown in FIG. 6 is formed integrally and simultaneously with the P+-type semiconductor layer 11 and is rectangular in shape. A wiring layer 16 made of aluminum has one end connected with the surface of the wiring layer 14 through a window portion 17, and the other end extends over the surface of the insulating layer 5 on the amorphous intrinsic (I) semiconductor thin layer 12 to a position so as to oppose the P+-type semiconductor 15 through the insulating layer 5. Thus, the P+-type semiconductor 15 and the wiring layer 16 which faces it through the insulating layer 5 form a capacitor $C_P$. The capacitor $C_P$ is connected in parallel with the PIN photodiode PD, so that a photo detecting circuit as shown in FIG. 7 exists.

Figure 4:
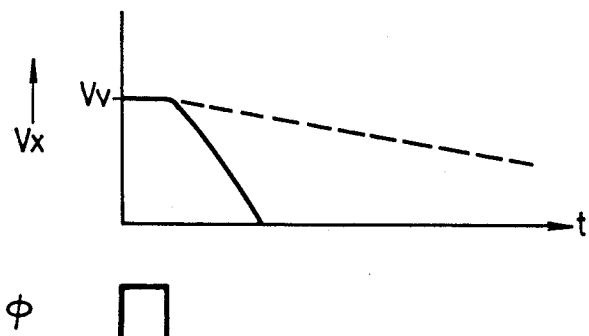
FIG. 4 is a characteristic graph showing the output voltage of the previously proposed PIN photodiodes in a dark

The PIN photodiode PD has an inherent reverse bias capacitance $C_H$ and the capacitor $C_P$ formed of the wiring layer 16 and the P+-type semiconductor 15 are connected in parallel therewith so as to compensate for the small size of the capacitance of the inherent reverse bias capacitance $C_H$ of the PIN photodiode PD. It is therefore possible to increase the dynamic range which would be small due to the insufficient capacitance $C_H$ and thus to improve the signal holding characteristic. Specifically, due to the capacitor $C_P$ the effective reverse bias capacitance of the lateral PIN photodiode PD can be increased relative to that of the sandwich PIN photodiode as shown by the dashed line in FIG. 4.

Further, since the wiring layer 16 made of aluminum is arranged to pass over the amorphous intrinsic (I) semiconductor thin layer 12, the photo converting efficiency of the PIN photodiode will also be increased. That is, since aluminum which forms the wiring layer 16 has a reflecting property and is arranged above the semiconductor thin layer 12 which effects photo-electric conversion, even if a portion of the incident light on the semiconductor thin layer 12 passes through the semiconductor layer 12, such portion of passed light is reflected by the wiring layer 16 so as to be returned to the semiconductor thin layer 12 where it is subjected to photo-electric conversion. Thus, the light incident on the semiconductor thin layer 12 is substantially photo-electrically converted, which makes the photo-electric converting efficiency substantially higher.

As described above, the photosensor of the present embodiment comprises a PIN photodiode which is formed of a P-type semiconductor layer, an intrinsic semiconductor layer and a N-type semiconductor layer which is laterally arranged on the insulating substrate, and which is characterized by forming a capacitor, in the vicinity of the PIN photodiode on the insulating substrate. Also an electrode is connected to either one of the P-type semiconductor layer or the N-type semiconductor layer and another electrode is arranged on the above-mentioned electrode through the insulating layer and is connected to the other one of the P-type semiconductor layer or the N-type semiconductor layer.

Thus, since the photosensor of the present embodiment has a capacitor connected in parallel with the reverse bias capacitance of the PIN photodiode, the reverse bias capacitance is substantially increased by such capacitor, and the dynamic range becomes wider, and accordingly the photodetecting signal holding characteristic is improved.

A second embodiment of the present invention will be described with reference to FIGS. 8-10 in which the parts corresponding to those in FIGS. 5 and 6 are designated by the same reference numerals and the explanation thereof will be omitted.

The wiring layer 14 made of aluminum is formed simultaneously with the wiring layer 8 and is connected to the source of the MOS transistor Q through the window portion 6, and to the surface of the N+-type semiconductor layer 10 through another window portion 13. The wiring layer 16 bypasses the PIN photodiode PD, and is formed on the P+-type semiconductor layer 15 through the insulating layer 5. The portion bypassing the PIN photodiode PD, of the wiring layer 16 is made to be narrower, and the portion over the semiconductor layer 15 is made to be wider so that it faces the semiconductor layer 15.

As described above, the capacitor $C_P$ is formed of the P+-type semiconductor layer 15 and the wiring layer 16 which faces the layer 15 through the insulating layer 5. The capacitor $C_P$ is connected in parallel with the PIN photodiode PD and forms the photo detecting circuit as shown in FIG. 7.

Thus, in the same manner as the first embodiment, the PIN photodiode PD has an inherent reverse bias capacitance $C_H$ and the capacitor $C_P$ formed of the wiring layer 16 and the P+-type semiconductor layer 15 is connected in parallel therewith so as to compensate for the small amount of capacitance of the inherent reverse bias capacitance $C_H$ of the PIN photodiode PD. It is therefore possible to increase the capacitance in the dynamic range and compensate for the small capacitance of the reverse bias capacitance and accordingly improve the signal holding characteristic. Specifically, due to the capacitor $C_P$, the effective reverse bias capacitance of the PIN photodiode PD is increased to that of the sandwich PIN photodiode as shown by the dashed line in FIG. 4.

Since the P+-type semiconductor layer 15 which forms one of the electrodes of the capacitor $C_P$ is formed integrally with the P+-type semiconductor layer 11, and the wiring layer 16 constituting the other electrode of the same is formed simultaneously with the wiring layer 8, it is not necessary to provide an additional step in the process for forming the capacitor $C_P$, which improves the characteristics, such as widening the dynamic range, and thus the manufacturing process remains simple and inexpensive.

As described above, the photosensor according to the second embodiment of the present invention comprises a PIN photodiode formed of a P-type semiconductor layer, an intrinsic semiconductor layer and a N-type semiconductor layer which are arranged parallel on the insulating substrate, and is characterized by forming a capacitor, which consists of an electrode made of the semiconductor layer which is formed integrally with one of the N-type or P-type semiconductor layers and the electrode made of the wiring layer is connected to the surface of the other one of the P-type or N-type semiconductor layers through the window portion which is formed through the insulating layer and stacked on the above-mentioned electrode through the insulating layer in the vicinity of the PIN photodiode on the insulating substrate.

Thus, since the photosensor of the second embodiment has a capacitor connected in parallel with the reverse bias capacitance of the PIN photodiode, the total reverse bias capacitance is substantially increased by the capacitor, the dynamic range becomes wider, and consequently the photodetecting signal holding characteristic is improved.

Further, the capacitor has one of its electrode formed during the same process as for forming one of the P-type or the N-type semiconductor layers constituting the PIN photodiode, and the other electrode is formed during the same process for forming the wiring layer which is electrically connected to the other semiconductor layer. It is therefore possible to form the capacitor without making the manufacturing process of the photosensor more complicated, thereby improving the characteristics, such as widening the dynamic range, without increasing the manufacturing costs.

The above description is given for preferred embodiments of the invention but it will be apparent that many modifications and variations could be effected by one skilled in the art without departing from the spirit or scope of the novel concepts of the invention so that the scope of the invention should be determined only by the appended claims.

I claim as my invention:

1. A photosensor comprising:
a PIN photodiode formed of a P-type semiconductor layer, an intrinsic semiconductor layer and an N-type semiconductor layer mounted on an insulating substrate; said p-type semiconductor layer an said n-type semiconductor layer laterally offset from each other and said intrinsic semiconductor layer overlying said p-type and n-type semiconductor layers and said insulating substrate; and
a capacitor formed with a first electrode (16) connected to one (10) of said P-type semiconductor layer (11) or said N-type semiconductor layer (10) and a second electrode (15) formed over said insulating substrate and extending through an insulating layer and connected to the other one of said P-type semiconductor layer (11) or said N-type semiconductor layer (10).

2. A photosensor comprising:
a PIN photodiode formed of a P-type semiconductor layer, an intrinsic semiconductor layer and an N-type semiconductor layer mounted on an insulating substrate; said p-type semiconductor layer and said n-type semiconductor layer laterally offset from each other and said intrinsic semiconductor layer overlying said p-type and n-type semiconductor layers and said insulating substrate; and
a capacitor formed with a first electrode (15) made of a semiconductor layer formed integrally with one of said N-type semiconductor layer or said P-type semiconductor layer and a second electrodes 16, 14 made of a wiring layer which is connected to a surface or the other one of said N-type semiconductor layer of said p-type semiconductor layer and extending through a window (13) which is formed through an insulating layer.

3. A photosensor with improved characteristics comprising an insulating substrate, a p-type semiconductor layer, an intrinsic semiconductor layer and an n-type semiconductor layer mounted on said insulating substrate; said p-type semiconductor layer and said n-type semiconductor layer laterally offset from each other and said intrinsic semiconductor layer overlying said p-type and n-type semiconductor layers and said insulating substrate to form a PIN photodiode, a first electrode (15) connected to either said p-type semiconductor layer or said n-type semiconductor layer, an insulating layer (15) covering at least a part of said first electrode (15), and a second electrode (16) formed over said first electrode and separated therefrom by said insulating layer (5) and said second electrode (16) connected to either said n-type semiconductor layer (10) or said p-type layer (11) so as to form a capacitor which is in parallel with the internal capacitance of said PIN photodiode.

* * * * *